United States Patent
Terasaki

(10) Patent No.: US 11,881,439 B2
(45) Date of Patent: *Jan. 23, 2024

(54) COPPER/CERAMIC JOINED BODY, INSULATING CIRCUIT SUBSTRATE, COPPER/CERAMIC JOINED BODY PRODUCTION METHOD, AND INSULATING CIRCUIT SUBSTRATE PRODUCTION METHOD

(71) Applicant: MITSUBISHI MATERIALS CORPORATION, Tokyo (JP)

(72) Inventor: Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/613,247

(22) PCT Filed: Aug. 13, 2020

(86) PCT No.: PCT/JP2020/030787
§ 371 (c)(1),
(2) Date: Nov. 22, 2021

(87) PCT Pub. No.: WO2021/033622
PCT Pub. Date: Feb. 25, 2021

(65) Prior Publication Data
US 2022/0223492 A1 Jul. 14, 2022

(30) Foreign Application Priority Data

Aug. 21, 2019 (JP) .................................. 2019-151143
Aug. 6, 2020 (JP) .................................. 2020-134035

(51) Int. Cl.
*H01L 23/373* (2006.01)
*B23K 20/10* (2006.01)
(Continued)

(52) U.S. Cl.
CPC .......... *H01L 23/3735* (2013.01); *B23K 20/10* (2013.01); *C04B 37/026* (2013.01);
(Continued)

(58) Field of Classification Search
None
See application file for complete search history.

(56) References Cited

U.S. PATENT DOCUMENTS

2015/0016842 A1\* 1/2015 Sabu .................... H01T 19/00
399/168
2018/0346387 A1 12/2018 Terasaki et al.
(Continued)

FOREIGN PATENT DOCUMENTS

CN 104409425 A 3/2015
CN 109417056 A 3/2019
(Continued)

OTHER PUBLICATIONS

Office Action dated Apr. 24, 2022, issued for Chinese Patent Application No. 202080052355.9 and English translation thereof.
(Continued)

*Primary Examiner* — Seth Dumbris
(74) *Attorney, Agent, or Firm* — Locke Lord LLP; James E. Armstrong, IV; Nicholas J. DiCeglie, Jr.

(57) ABSTRACT

This copper/ceramic bonded body includes: a copper member made of copper or a copper alloy; and a ceramic member made of silicon nitride, wherein the copper member and the ceramic member are bonded to each other, a Mg—N compound phase extending from a ceramic member side to a copper member side is present at a bonded interface between the copper member and the ceramic member, and at least a part of the Mg—N compound phase enters into the copper member.

8 Claims, 4 Drawing Sheets

(51) Int. Cl.
*C04B 37/02* (2006.01)
*B23K 103/12* (2006.01)
*B23K 103/00* (2006.01)

(52) U.S. Cl.
CPC ...... *B23K 2103/12* (2018.08); *B23K 2103/52* (2018.08); *C04B 2237/124* (2013.01); *C04B 2237/368* (2013.01); *C04B 2237/407* (2013.01); *Y10T 428/12576* (2015.01)

(56) References Cited

U.S. PATENT DOCUMENTS

| | | | |
|---|---|---|---|
| 2020/0006213 | A1 | 1/2020 | Terasaki |
| 2021/0178509 | A1* | 6/2021 | Terasaki ............ D01F 1/10 |

FOREIGN PATENT DOCUMENTS

| | | | |
|---|---|---|---|
| EP | 3960722 | A1 | 3/2022 |
| JP | 2001-217362 | A | 8/2001 |
| JP | 3211856 | B2 | 9/2001 |
| JP | 2004-255416 | A | 9/2004 |
| JP | 2005-305526 | A | 11/2005 |
| JP | 2005305526 | A * | 11/2005 |
| JP | 4375730 | B2 | 12/2009 |
| JP | 2017-108107 | A | 6/2017 |
| JP | 2018-140929 | A | 9/2018 |
| TW | 201542496 | A | 11/2015 |
| WO | 2017/090422 | A1 | 6/2017 |
| WO | 2018/159590 | A1 | 9/2018 |
| WO | 2019/088222 | A1 | 5/2019 |
| WO | 2020/044593 | A1 | 3/2020 |
| WO | 2020/045388 | A1 | 3/2020 |

OTHER PUBLICATIONS

Supplementary European Search Report dated May 23, 2022, issued for European Patent Application No. 20855157.2.
International Search Report dated Oct. 20, 2020, issued for PCT/JP2020/030787 and English translation thereof.
Office Action dated Nov. 16, 2022, issued for Chinese Patent Application No. CN 202080083468.5 and English Translation of the Search Report.
International Search Report dated Jan. 19, 2021, issued for PCT/JP2020/044547 and English translation thereof.
Office Action issued in Taiwanese Patent Application No. TW 109128044, dated Oct. 2, 2023, with English translation of Search Report.
L. Mueller et al.: "Magnesia and Yttria Based Coatings for Direct-Copper-Bonding of Silicon Nitride Ceramics", Advanced Ceramic Coatings and Interfaces Iv - 33RD International Conference On Advanced Ceramics and Composites 20090118 TO 20090123 Daytona Beach, Fl, USA, Nov. 9, 2009 (Nov. 9, 2009), pp. 21-32, XP055151729, Hoboken, NJ, USA DOI: 10.1002/9780470584293.ch3 ISBN: 978-0-470-45753-5.
Search Report issued in corresponding European Patent Application No. EP 20896480.9, dated Nov. 27, 2023.

* cited by examiner

COPPER/CERAMIC JOINED BODY, INSULATING CIRCUIT SUBSTRATE, COPPER/CERAMIC JOINED BODY PRODUCTION METHOD, AND INSULATING CIRCUIT SUBSTRATE PRODUCTION METHOD

TECHNICAL FIELD

The present invention relates to a copper/ceramic bonded body in which a copper member made of copper or a copper alloy and a ceramic member are bonded to each other, an insulating circuit substrate in which a copper sheet made of copper or a copper alloy is bonded to a surface of a ceramic substrate, a method for producing a copper/ceramic bonded body, and a method for producing an insulating circuit substrate.

The present application claims priority on Japanese Patent Application No. 2019-151143 filed on Aug. 21, 2019, and Japanese Patent Application No. 2020-134035 filed on Aug. 6, 2020, the contents of which are incorporated herein by reference.

BACKGROUND ART

A power module, an LED module, and a thermoelectric module have a structure in which a power semiconductor element, an LED element, and a thermoelectric element are bonded to an insulating circuit substrate, and in the insulating circuit substrate, a circuit layer made of a conductive material is formed on one surface of an insulating layer.

For example, a power semiconductor element for high-power control used for controlling a wind power generation, an electric vehicle, a hybrid vehicle, or the like has a large amount of heat generated during operation. Therefore, as a substrate on which the power semiconductor element is mounted, an insulating circuit substrate including a ceramic substrate and a circuit layer formed by bonding a metal sheet having excellent conductivity to one surface of the ceramic substrate has been widely used in the related art. As the insulating circuit substrate, one including a metal layer formed by bonding a metal sheet to the other surface of the ceramic substrate is also provided.

For example, Patent Document 1 proposes an insulating circuit substrate in which a circuit layer and a metal layer are formed by bonding a copper sheet to each of one surface and the other surface of a ceramic substrate. In Patent Document 1, the copper sheet is disposed on each of one surface and the other surface of the ceramic substrate with an Ag—Cu—Ti-based brazing material interposed therebetween, and the copper sheet is bonded thereto by performing a heating treatment (so-called active metal brazing method). In the active metal brazing method, since the brazing material containing Ti as an active metal is used, the wettability between the molten brazing material and the ceramic substrate is improved, and the ceramic substrate and the copper sheet are satisfactorily bonded to each other.

Patent Document 2 proposes an insulating circuit substrate in which a ceramic substrate and a copper sheet are bonded to each other by using a Cu—Mg—Ti-based brazing material.

In Patent Document 2, the ceramic substrate and the copper sheet are bonded to each other by heating at a temperature of 560° C. to 800° C. in a nitrogen gas atmosphere, and Mg in a Cu—Mg—Ti alloy is sublimated and Mg does not remain at a bonded interface, while titanium nitride (TiN) is not substantially formed.

PRIOR ART DOCUMENTS

Patent Document

Patent Document 1: Japanese Patent No. 3211856
Patent Document 2: Japanese Patent No. 4375730

DISCLOSURE OF INVENTION

Problems to be Solved by the Invention

By the way, in the circuit layer of the above-described insulating circuit substrate, a terminal material or the like may be subjected to ultrasonic welding.

In the insulating circuit substrates disclosed in Patent Documents 1 and 2, when ultrasonic waves are applied to bond the terminal material or the like, cracks are generated at the bonded interface, and there is a concern that the circuit layer may be peeled.

The present invention has been made in view of the above-described circumstances, and an object of the present invention is to provide a copper/ceramic bonded body, an insulating circuit substrate, a method for producing a copper/ceramic bonded body, and a method for producing an insulating circuit substrate, which can suppress peeling of a copper member from a ceramic member and generation of cracks in the ceramic member even when ultrasonic welding is performed.

Solutions for Solving the Problems

In order to solve the above-described problem, a copper/ceramic bonded body according to one aspect of the present invention (hereinafter, referred to as a "copper/ceramic bonded body according to the present invention") includes a copper member made of copper or a copper alloy, and a ceramic member made of silicon nitride, in which the copper member and the ceramic member are bonded to each other, a Mg—N compound phase extending from a ceramic member side to a copper member side is present at a bonded interface between the copper member and the ceramic member, and at least a part of the Mg—N compound phase enters into the copper member.

According to the copper/ceramic bonded body according to the present invention, the Mg—N compound phase extending from the ceramic member side to the copper member side is present at the bonded interface between the copper member and the ceramic member, and at least a part of the Mg—N compound phase enters into the copper member. Therefore, Mg as a bonding material is sufficiently reacted with nitrogen of the ceramic member, and the copper member and the ceramic member are firmly bonded to each other. By an anchor effect of the Mg—N compound phase that has entered into the copper member, peeling of the copper member from the ceramic member and generation of cracks in the ceramic member can be suppressed even when ultrasonic waves are applied.

In the copper/ceramic bonded body according to the present invention, it is preferable that in a unit length along a bonded interface, a number density of the Mg—N compound phases having a longitudinal direction length of 100 nm or more is 8 pieces/μm or more.

In this case, since the number of the Mg—N compound phase sufficiently grown from the ceramic member side to the copper member side is ensured, the anchor effect of the Mg—N compound phase that has entered into the copper member can be reliably obtained, and even when ultrasonic waves are applied, peeling of the copper member from the ceramic member and generation of cracks in the ceramic member can be further suppressed.

In the copper/ceramic bonded body according to the present invention, it is preferable that a Si concentration in the Mg—N compound phase is 25 atomic % or less.

In this case, since local precipitation of a Si single phase in the Mg—N compound phase is suppressed, and the strength of the Mg—N compound phase is sufficiently ensured, the anchor effect of the Mg—N compound phase that has entered into the copper member can be reliably obtained, and even when ultrasonic waves are applied, peeling of the copper member from the ceramic member and generation of cracks in the ceramic member can be further suppressed.

An insulating circuit substrate according to another aspect of the present invention (hereinafter, referred to as an "insulating circuit substrate according to the present invention") includes a copper sheet made of copper or a copper alloy, and a ceramic substrate made of silicon nitride, in which the copper sheet is bonded to a surface of the ceramic substrate, a Mg—N compound phase extending from a ceramic substrate side to a copper sheet side is present at a bonded interface between the copper sheet and the ceramic substrate, and at least a part of the Mg—N compound phase enters into the copper sheet.

According to the insulating circuit substrate according to the present invention, the Mg—N compound phase extending from the ceramic substrate side to the copper sheet side is present at the bonded interface between the copper sheet and the ceramic substrate, and at least a part of the Mg—N compound phase enters into the copper sheet. Therefore, Mg as a bonding material is sufficiently reacted with nitrogen of the ceramic substrate, and the copper sheet and the ceramic substrate are firmly bonded to each other. By an anchor effect of the Mg—N compound phase that has entered into the copper sheet, peeling of the copper sheet from the ceramic substrate and generation of cracks in the ceramic substrate can be suppressed even when ultrasonic waves are applied.

In the insulating circuit substrate according to the present invention, it is preferable that in a unit length along a bonded interface, a number density of the Mg—N compound phases having a longitudinal direction length of 100 nm or more is 8 pieces/µm or more.

In this case, since the number of the Mg—N compound phase sufficiently grown from the ceramic substrate side to the copper sheet side is ensured, the anchor effect of the Mg—N compound phase that has entered into the copper sheet can be reliably obtained, and even when ultrasonic waves are applied, peeling of the copper sheet from the ceramic substrate and generation of cracks in the ceramic substrate can be further suppressed.

In the insulating circuit substrate according to the present invention, it is preferable that a Si concentration in the Mg—N compound phase is 25 atomic % or less.

In this case, since local precipitation of a Si single phase in the Mg—N compound phase is suppressed, and the strength of the Mg—N compound phase is sufficiently ensured, the anchor effect of the Mg—N compound phase that has entered into the copper sheet can be reliably obtained, and even when ultrasonic waves are applied, peeling of the copper sheet from the ceramic substrate and generation of cracks in the ceramic substrate can be further suppressed.

A method for producing a copper/ceramic bonded body according to still another aspect of the present invention (hereinafter, referred to as a "method for producing a copper/ceramic bonded body according to the present invention") is a method for producing the copper/ceramic bonded body described above, the method includes a Mg disposing step of disposing Mg between the copper member and the ceramic member, a laminating step of laminating the copper member and the ceramic member with Mg interposed therebetween, and a bonding step of performing a heating treatment on the laminated copper member and ceramic member with Mg interposed therebetween in a state of being pressed in a lamination direction under a vacuum atmosphere to bond the copper member and the ceramic member to each other, in which, in the Mg disposing step, an amount of Mg is set to be in a range of 0.34 mg/cm$^2$ or more and 4.35 mg/cm$^2$ or less, and in the bonding step, a temperature increase rate in a temperature range of 480° C. or higher and lower than 650° C. is set to be 5° C./min or higher, and heating is held at a temperature of 650° C. or higher for 30 minutes or longer.

According to the method for producing a copper/ceramic bonded body having the configuration, in the Mg disposing step, the amount of Mg is set to be in the range of 0.34 mg/cm$^2$ or more and 4.35 mg/cm$^2$ or less. Therefore, a sufficient Cu—Mg liquid phase required for an interfacial reaction can be obtained. Accordingly, the copper member and the ceramic member can be reliably bonded to each other.

In the bonding step, the temperature increase rate in the temperature range of 480° C. or higher and lower than 650° C. is set to 5° C./min or higher, and heating is held at the temperature of 650° C. or higher for 30 minutes or longer. Therefore, the Cu—Mg liquid phase required for the interfacial reaction can be held for a certain period of time or longer, a uniform interfacial reaction can be promoted, and the Mg—N compound phase extending from the ceramic member side to the copper member side can be reliably formed.

A method for producing an insulating circuit substrate according to still another aspect of the present invention (hereinafter, referred to as a "method for producing an insulating circuit substrate according to the present invention") is a method for producing the insulating circuit substrate described above, the method includes a Mg disposing step of disposing Mg between the copper sheet and the ceramic substrate, a laminating step of laminating the copper sheet and the ceramic substrate with Mg interposed therebetween, and a bonding step of performing a heating treatment on the laminated copper sheet and ceramic substrate with Mg interposed therebetween in a state of being pressed in a lamination direction under a vacuum atmosphere to bond the copper sheet and the ceramic substrate to each other, in which, in the Mg disposing step, an amount of Mg is set to be in a range of 0.34 mg/cm$^2$ or more and 4.35 mg/cm$^2$ or less, and in the bonding step, a temperature increase rate in a temperature range of 480° C. or higher and lower than 650° C. is set to be 5° C./min or higher, and heating is held at a temperature of 650° C. or higher for 30 minutes or longer.

According to the method for producing an insulating circuit substrate having the configuration, in the Mg disposing step, the amount of Mg is set to be in the range of 0.34 mg/cm$^2$ or more and 4.35 mg/cm$^2$ or less. Therefore, a sufficient Cu—Mg liquid phase required for an interfacial reaction can be obtained. Accordingly, the copper sheet and the ceramic substrate can be reliably bonded to each other.

In the bonding step, the temperature increase rate in the temperature range of 480° C. or higher and lower than 650° C. is set to 5° C./min or higher, and heating is held at the temperature of 650° C. or higher for 30 minutes or longer. Therefore, the Cu—Mg liquid phase required for the interfacial reaction can be held for a certain period of time or longer, a uniform interfacial reaction can be promoted, and the Mg—N compound phase extending from the ceramic substrate side to the copper sheet side can be reliably formed.

Effects of Invention

According to the present invention, it is possible to provide a copper/ceramic bonded body, an insulating circuit substrate, a method for producing a copper/ceramic bonded body, and a method for producing an insulating circuit substrate, which can suppress peeling of a copper member from a ceramic member and generation of cracks in the ceramic member even when ultrasonic welding is performed.

EMBODIMENTS FOR CARRYING OUT THE INVENTION

Hereinafter, an embodiment of the present invention will be described with reference to the accompanying drawings.

Figure 1:
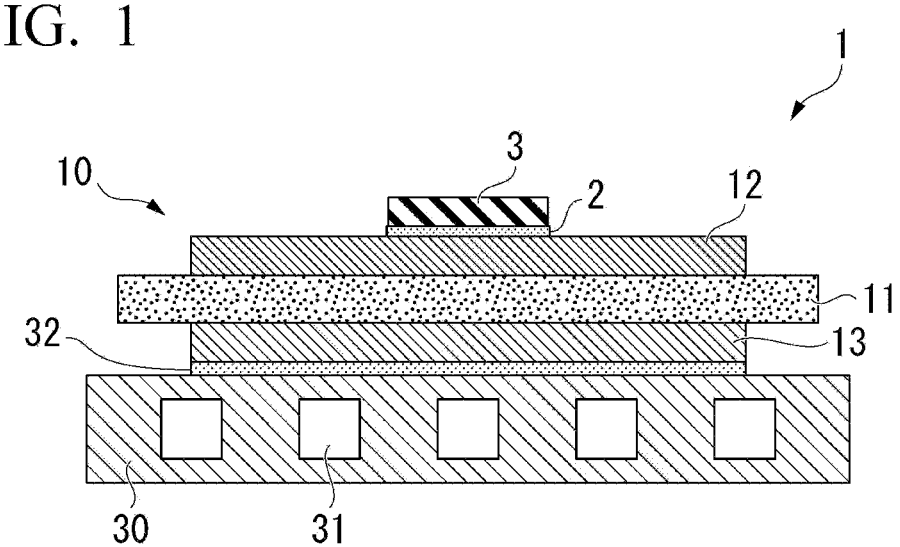
FIG. 1 is a schematic explanatory view of a power module using an insulating circuit substrate according to an embodiment of the present invention.

A copper/ceramic bonded body to the present embodiment is an insulating circuit substrate 10 formed by bonding a copper sheet 22 (circuit layer 12) and a copper sheet 23 (metal layer 13) as copper members made of copper or a copper alloy to a ceramic substrate 11 as a ceramic member made of ceramics. FIG. 1 shows a power module 1 including an insulating circuit substrate 10 according to the present embodiment.

The power module 1 includes the insulating circuit substrate 10 on which the circuit layer 12 and the metal layer 13 are disposed, a semiconductor element 3 bonded to one surface (upper surface in FIG. 1) of the circuit layer 12 with a bonding layer 2 interposed therebetween, and a heat sink 30 disposed on the other side (lower side in FIG. 1) of the metal layer 13.

The semiconductor element 3 is made of a semiconductor material such as Si. The semiconductor element 3 and the circuit layer 12 are bonded to each other with the bonding layer 2 interposed therebetween.

The bonding layer 2 is made of, for example, a Sn—Ag-based, Sn—In-based, or Sn—Ag—Cu-based solder material.

The heat sink 30 dissipates heat from the above-mentioned insulating circuit substrate 10. The heat sink 30 is made of copper or a copper alloy, and in the present embodiment, the heat sink 30 is made of phosphorus deoxidized copper. The heat sink 30 is provided with a passage 31 through which a cooling fluid flows.

In the present embodiment, the heat sink 30 and the metal layer 13 are bonded to each other by a solder layer 32 made of a solder material. The solder layer 32 is made of, for example, a Sn—Ag-based, Sn-ln-based, or Sn—Ag—Cu-based solder material.

As shown in FIG. 1, the insulating circuit substrate 10 of the present embodiment includes the ceramic substrate 11, the circuit layer 12 disposed on one surface (upper surface in FIG. 1) of the ceramic substrate 11, and the metal layer 13 disposed on the other surface (lower surface in FIG. 1) of the ceramic substrate 11.

The ceramic substrate 11 is made of silicon nitride ($Si_3N_4$) having excellent insulating properties and heat radiation. The thickness of the ceramic substrate 11 is set to be in a range of, for example, 0.2 mm or more and 1.5 mm or less, and in the present embodiment, the thickness is set to 0.32 mm.

Figure 4:
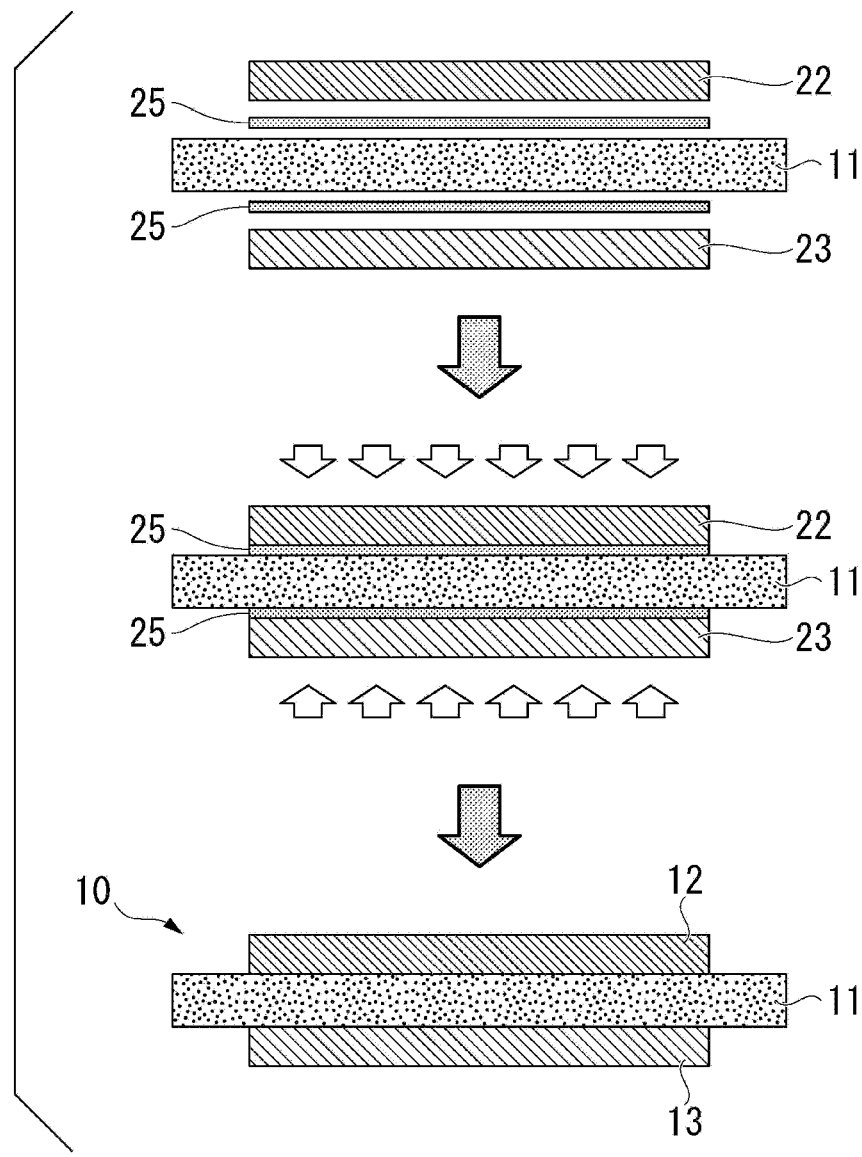
FIG. 4 is a schematic explanatory view of the method for producing the insulating circuit substrate according to the embodiment of the present invention.

As shown in FIG. 4, the circuit layer 12 is formed by bonding the copper sheet 22 made of copper or a copper alloy to one surface (upper surface in FIG. 4) of the ceramic substrate 11.

In the present embodiment, the circuit layer 12 is formed by bonding the copper sheet 22 made of a rolled sheet of oxygen-free copper to the ceramic substrate 11.

The thickness of the copper sheet 22 serving as the circuit layer 12 is set to be in a range of 0.1 mm or more and 2.0 mm or less, and in the present embodiment, the thickness is set to 0.6 mm.

As the copper sheet 22, tough pitch copper can also be used.

As shown in FIG. 4, the metal layer 13 is formed by bonding the copper sheet 23 made of copper or a copper alloy to the other surface (lower surface in FIG. 4) of the ceramic substrate 11.

In the present embodiment, the metal layer 13 is formed by bonding the copper sheet 23 made of a rolled sheet of oxygen-free copper to the ceramic substrate 11.

The thickness of the copper sheet 23 serving as the metal layer 13 is set to be in a range of 0.1 mm or more and 2.0 mm or less, and in the present embodiment, the thickness is set to 0.6 mm.

As the copper sheet 23, tough pitch copper can also be used.

Figure 2A:
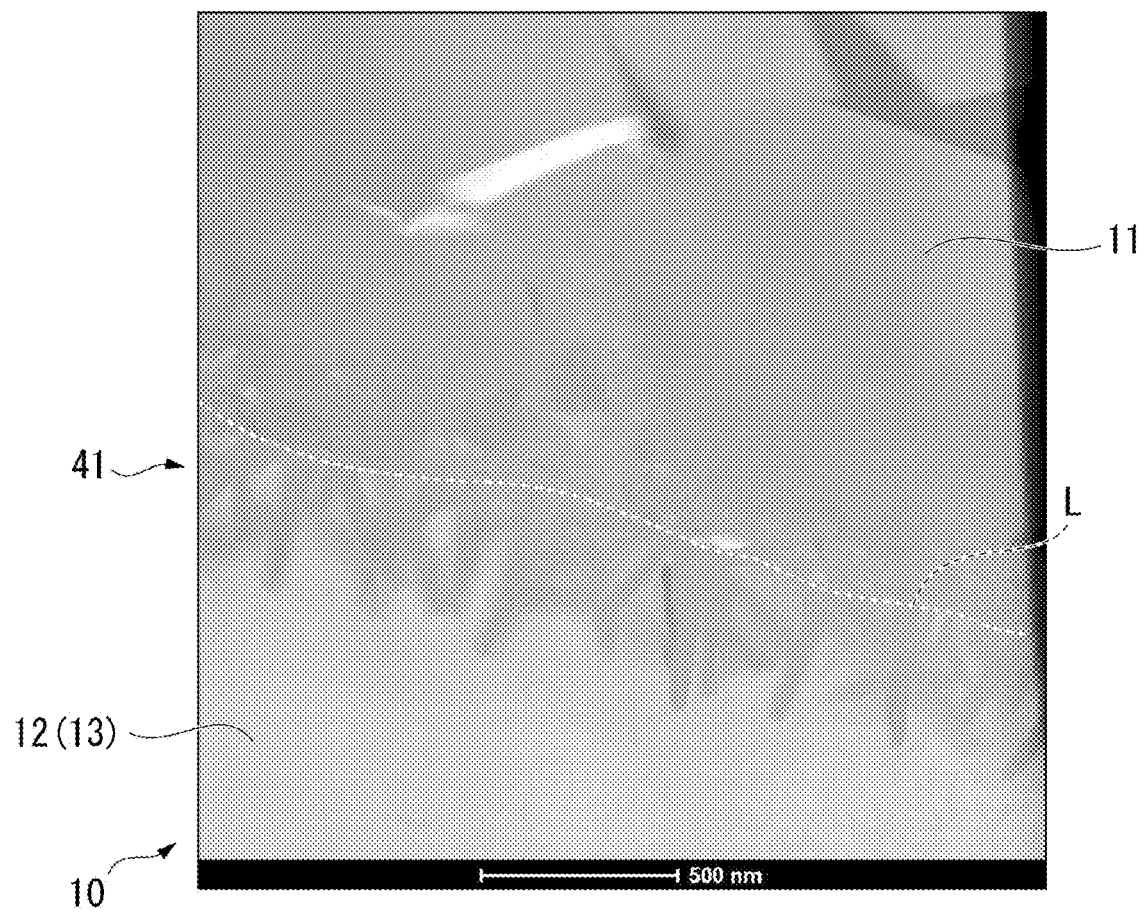
FIG. 2A is an observation result (BF STEM image) of a bonded interface between a circuit layer (metal layer) and a ceramic substrate of the insulating circuit substrate according to the embodiment of the present invention.

At a bonded interface between the ceramic substrate 11 and the circuit layer 12 (metal layer 13), as shown in FIG. 2A, a Mg—N compound phase 41 extending from the ceramic substrate 11 side to the circuit layer 12 (metal layer 13) side is present. At least a part of the Mg—N compound phase 41 enters into the circuit layer 12 (metal layer 13). The Mg—N compound phase 41 is formed by reacting magnesium (Mg) used as a bonding material with nitrogen (N) contained in the ceramic substrate 11.

The Mg—N compound phase 41 may be a region where Mg and N coexist, in which the concentration of Mg is 40 atomic % or more and 65 atomic % or less with respect to 100 atomic % of the total of Mg, N, and Si, and the aspect ratio (longitudinal direction length/lateral direction length) of the region is 1.2 or more.

Figure 2B:
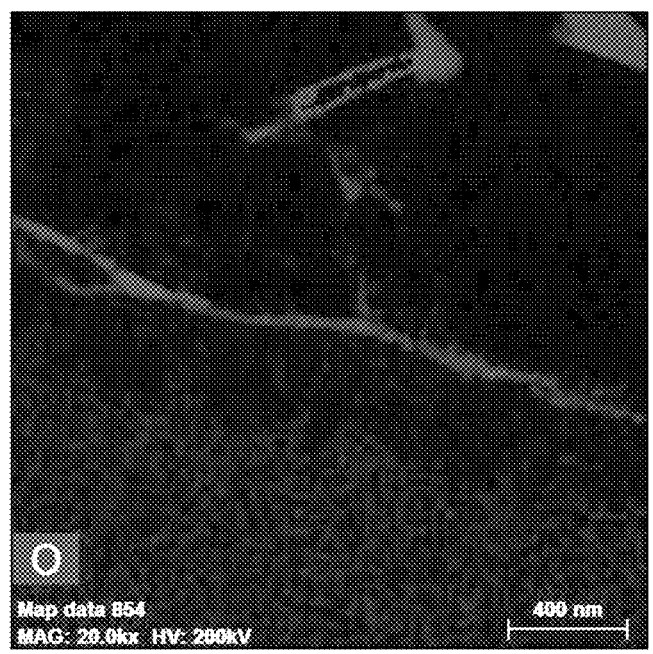
FIG. 2B is an observation result (oxygen distribution diagram) of the bonded interface between the circuit layer (metal layer) and the ceramic substrate of the insulating circuit substrate according to the embodiment of the present invention.

In the present embodiment, it is preferable that in a unit length along the bonded interface, the number density of the Mg—N compound phases 41 having the longitudinal direction length of 100 nm or more is 8 pieces/μm or more. An auxiliary line L in FIG. 2A shows the bonded interface. In the present embodiment, the detection position of oxygen is set as the bonded interface (see FIG. 2B).

The number density of the Mg—N compound phases 41 having the longitudinal direction length of 100 nm or more is preferably 10 pieces/μm or more, and more preferably 12 pieces/μm or more.

Figure 3:
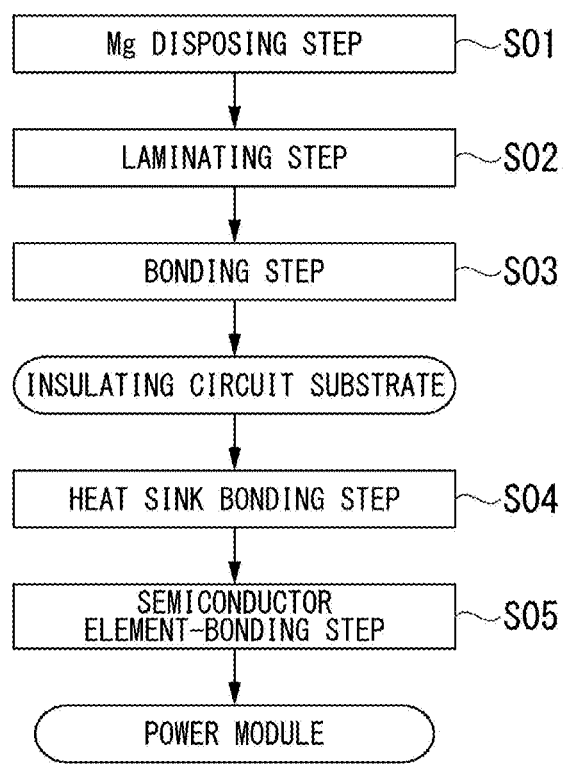
FIG. 3 is a flowchart of a method for producing the insulating circuit substrate according to the embodiment of the present invention.

Hereinafter, a method for producing the insulating circuit substrate 10 according to the present embodiment will be described with reference to FIGS. 3 and 4.

(Mg Disposing Step S01)

First, the ceramic substrate 11 made of silicon nitride ($Si_3N_4$) is prepared, and as shown in FIG. 4, Mg is disposed between the copper sheet 22 serving as the circuit layer 12 and the ceramic substrate 11, and between the copper sheet 23 serving as the metal layer 13 and the ceramic substrate 11.

In the present embodiment, a Mg foil 25 is disposed between the copper sheet 22 serving as the circuit layer 12 and the ceramic substrate 11, and between the copper sheet 23 serving as the metal layer 13 and the ceramic substrate 11.

In a Mg disposing step S01, the amount of Mg to be disposed is set to be in a range of 0.34 mg/cm$^2$ or more and 4.35 mg/cm$^2$ or less.

The amount of Mg to be disposed is preferably 0.52 mg/cm$^2$ or more, and more preferably 0.69 mg/cm$^2$ or more. On the other hand, the amount of Mg to be disposed is preferably 3.48 mg/cm$^2$ or less, and more preferably 2.61 mg/cm$^2$ or less.

(Laminating Step S02)

Next, the copper sheet 22 and the ceramic substrate 11 are laminated with the Mg foil 25 interposed therebetween, and the ceramic substrate 11 and the copper sheet 23 are laminated with the Mg foil 25 interposed therebetween.

(Bonding Step S03)

Next, the copper sheet 22, the Mg foil 25, the ceramic substrate 11, the Mg foil 25, and the copper sheet 23 which are laminated are pressed in a lamination direction, and are loaded into a vacuum furnace and heated such that the copper sheet 22, the ceramic substrate 11, and the copper sheet 23 are bonded together.

A heating treatment condition in the bonding step S03 is such that a temperature increase rate in a temperature range of 480° C. or higher and lower than 650° C. is set to be 5° C./min or higher and that heating is held at a temperature of 650° C. or higher for 30 minutes or longer. By defining the heating treatment condition in this way, the Cu—Mg liquid phase can be maintained in a high temperature state, the interfacial reaction is promoted, whereby the Mg—N compound phase 41 is formed.

The temperature increase rate in the temperature range of 480° C. or higher and lower than 650° C. is preferably 7° C./min or higher, and more preferably 9° C./min or higher. On the other hand, the temperature increase rate in the temperature range of 480° C. or higher and lower than 650° C. is preferably 15° C./min or lower, and more preferably 12° C./min or lower.

A holding temperature is preferably 700° C. or higher, and more preferably 750° C. or higher. On the other hand, the holding temperature is preferably 850° C. or lower, and more preferably 830° C. or lower.

A holding time is preferably 45 minutes or longer, and more preferably 60 minutes or longer. On the other hand, the holding time is preferably 180 minutes or shorter, and more preferably 150 minutes or shorter.

A pressing load in the bonding step S03 is preferably in a range of 0.049 MPa or more and 3.4 MPa or less.

A degree of vacuum in the bonding step S03 is preferably in a range of $1\times10^{-6}$ Pa or more and $5\times10^{-2}$ Pa or less.

As described above, the insulating circuit substrate 10 according to the present embodiment is produced by the Mg disposing step S01, the laminating step S02, and the bonding step S03.

(Heat Sink Bonding Step S04)

Next, the heat sink 30 is bonded to the other surface side of the metal layer 13 of the insulating circuit substrate 10.

The insulating circuit substrate 10 and the heat sink 30 are laminated with a solder material interposed therebetween and are loaded into a heating furnace such that the insulating circuit substrate 10 and the heat sink 30 are solder-bonded to each other with the solder layer 32 interposed therebetween.

(Semiconductor Element-Bonding Step S05)

Next, the semiconductor element 3 is bonded to one surface of the circuit layer 12 of the insulating circuit substrate 10 by soldering.

The power module 1 shown in FIG. 1 is produced by the above steps.

According to the insulating circuit substrate 10 (copper/ceramic bonded body) of the present embodiment having the above-described configuration, since the Mg—N compound phase 41 extending from the ceramic substrate 11 side to the circuit layer 12 (and the metal layer 13) is present at the bonded interface between the circuit layer 12 (and the metal layer 13) and the ceramic substrate 11, and at least a part of the Mg—N compound phase 41 enters into the circuit layer 12 (and the metal layer 13), Mg as a bonding material is sufficiently reacted with nitrogen of the ceramic substrate 11, and the circuit layer 12 (and the metal layer 13) and the ceramic substrate 11 are firmly bonded to each other. By the anchor effect of the Mg—N compound phase 41 that has entered into the circuit layer 12 (and the metal layer 13), even when ultrasonic waves are applied to the insulating circuit substrate 10 (copper/ceramic bonded body) for ultrasonic welding to bond the terminal material such as copper to the circuit layer 12 (metal layer 13), peeling of the circuit layer 12 (metal layer 13) from the ceramic substrate 11 and generation of cracks in the ceramic substrate 11 can be suppressed.

In the insulating circuit substrate 10 of the present embodiment, when the number density of the Mg—N compound phases 41 having the longitudinal direction length of 100 nm or more in a unit length along the bonded interface is 8 pieces/μm or more, the number of the Mg—N compound phase 41 sufficiently grown from the ceramic substrate 11 side to the circuit layer 12 (and the metal layer 13) side is ensured. Therefore, the anchor effect of the Mg—N compound phase 41 that has entered into the circuit layer 12 (and the metal layer 13) can be reliably obtained, and even when ultrasonic waves are applied, peeling of the circuit layer 12 (and the metal layer 13) from the ceramic substrate 11 and generation of cracks in the ceramic substrate 11 can be further suppressed.

In the insulating circuit substrate 10 of the present embodiment, it is preferable that the Si concentration in the Mg—N compound phase 41 is 25 atomic % or less. The Si concentration can be, for example, 9.7 atomic % or more.

In this case, since local precipitation of a Si single phase in the Mg—N compound phase 41 is suppressed, and the strength of the Mg—N compound phase 41 is sufficiently ensured, the anchor effect of the Mg—N compound phase 41 that has entered into the circuit layer 12 (and/or the metal layer 13) can be reliably obtained, and even when ultrasonic waves are applied, peeling of the copper sheet from the ceramic substrate and generation of cracks in the ceramic substrate can be further suppressed.

According to the method for producing the insulating circuit substrate 10 (copper/ceramic bonded body) of the present embodiment, in the Mg disposing step S01, since the amount of Mg to be disposed between the copper sheet 22 (copper sheet 23) and the ceramic substrate 11 is set to be in a range of 0.34 mg/cm$^2$ or more and 4.35 mg/cm$^2$ or less, a sufficient Cu—Mg liquid phase required for the interfacial reaction can be obtained. Accordingly, the copper sheet 22 (copper sheet 23) and the ceramic substrate 11 can be reliably bonded to each other, and the bonding strength between the circuit layer 12 (and the metal layer 13) and the ceramic substrate 11 can be ensured.

In the bonding step S03, the temperature increase rate in the temperature range of 480° C. or higher and lower than 650° C. is set to be 5° C./min or higher, and heating is held at the temperature of 650° C. or higher for 30 minutes or longer. Therefore, the Cu—Mg liquid phase required for the interfacial reaction can be held for a certain period of time or longer between the copper sheet 22 (copper sheet 23) and the ceramic substrate 11, a uniform interfacial reaction can be promoted, and the Mg—N compound phase 41 can be reliably formed at the bonded interface between the circuit layer 12 (and the metal layer 13) and the ceramic substrate 11.

The embodiment of the present invention has been described, but the present invention is not limited thereto, and can be appropriately changed without departing from the technical features of the present invention.

For example, in the present embodiment, the semiconductor element is mounted on the insulating circuit substrate to form the power module, but the present embodiment is not limited thereto. For example, an LED element may be mounted on the circuit layer of the insulating circuit substrate to form an LED module, or a thermoelectric element may be mounted on the circuit layer of the insulating circuit substrate to form a thermoelectric module.

In the insulating circuit substrate of the present embodiment, it has been described that both of the circuit layer and the metal layer are made of copper sheets made of copper or a copper alloy, but the present invention is not limited thereto.

For example, in a case where the circuit layer and the ceramic substrate are made of the copper/ceramic bonded body according to the present invention, there is no limitation on the material and the bonding method of the metal layer. There may be no metal layer, the metal layer may be made of aluminum or an aluminum alloy, or may be made of a laminate of copper and aluminum.

On the other hand, in a case where the metal layer and the ceramic substrate are made of the copper/ceramic bonded body according to the present invention, there is no limitation on the material and the bonding method of the circuit layer. The circuit layer may be made of aluminum or an aluminum alloy, or may be made of a laminate of copper and aluminum.

In the present embodiment, it has been described that the Mg foil is laminated between the copper sheet and the ceramic substrate in the Mg disposing step, but the present invention is not limited thereto, and a thin film made of Mg may be formed on the bonding surface of the ceramic substrate and the copper sheet by a sputtering method, a vapor deposition method, or the like. In addition, a paste using Mg or MgH$_2$ may be applied.

EXAMPLES

Hereinafter, results of confirmation experiments performed to confirm the effects of the present invention will be described.

Example 1

First, a ceramic substrate (40 mm×40 mm×0.32 mm) made of silicon nitride (Si$_3$N$_4$) was prepared.

A copper sheet (37 mm×37 mm×thickness of 0.5 mm) made of oxygen-free copper was bonded to both surfaces of the ceramic substrate under the conditions shown in Table 1 to obtain an insulating circuit substrate (copper/ceramic bonded body) of Invention Examples 1 to 9 and Comparative Example 1. A degree of vacuum of a vacuum furnace at the time of bonding was set to 2×10$^{-3}$ Pa.

The obtained insulating circuit substrate (copper/ceramic bonded body) was evaluated for the presence or absence of the Mg—N compound phase at the bonded interface, the number density of the Mg—N compound phases having the longitudinal direction length of 100 nm or more, the initial bonding rate, and the ultrasonic welding as follows.

(Mg—N Compound Phase)

An observation specimen was collected from the central portion of the obtained insulating circuit substrate (copper/ceramic bonded body), and the bonded interface between the copper sheet and the ceramic substrate was observed in a range of 2 μm×2 μm at an acceleration voltage of 200 kV and a magnification of 20,000 by using a transmission electron microscope (Titan ChemiSTEM manufactured by FEI Company), and when a region where Mg and N coexisted was present, the concentration of Mg was 40 atomic % or more and 65 atomic % or less with respect to 100 atomic % of the total of Mg, N, and Si, and the aspect ratio (longitudinal direction length/lateral direction length) of the region was 1.2 or more, the Mg—N compound phase was determined to be "present".

In the same measurement field, in a unit length along the bonded interface, the number density of the Mg—N compound phases having the longitudinal direction length of 100 nm or more was calculated.

In the measurement of the number density of the Mg—N compound phases having the longitudinal direction length of 100 nm or more, the detection position of the oxygen was set as the bonded interface between the copper sheet and the ceramic substrate. The number density was calculated from the following equation.

(Number density)=(total number of Mg—N compound phases having longitudinal direction length of 100 nm or more in measurement field)/(length of bonded interface in measurement field)

The Mg—N compound phases which were present at the boundary portion of the measurement field and could not be grasped as a whole were excluded from the number.

The number density was measured in 5 fields, and the average value is shown in the tables.

(Initial Bonding Rate)

A bonding rate between the copper sheet and the ceramic substrate was evaluated. Specifically, in the insulating circuit substrate, a bonding rate at the interface between the copper sheet and the ceramic substrate was evaluated using an ultrasonic flaw detector (FineSAT200 manufactured by Hitachi Power Solutions Co., Ltd.) and was calculated from the following equation. An initial bonding area was an area to be bonded before bonding, that is, an area of the circuit layer. In an image obtained by binarizing an ultrasonic-detected image, peeling was indicated by a white portion in the bonding part, and thus the area of the white portion was regarded as an exfoliation area.

(Bonding rate)={(initial bonding area)−(non-bonded part area)}/(initial bonding area)×100

(Evaluation of Ultrasonic Welding)

A copper terminal (10 mm×5 mm×1 mm in thickness) was bonded to the obtained insulating circuit substrate (copper/ceramic bonded body) by ultrasonic welding using an ultrasonic metal bonding machine (60C-904 manufactured by Ultrasonic Engineering Co., Ltd.) under the condition where a collapse amount was 0.3 mm. Ten copper terminals were bonded at a time.

After bonding, the bonded interface between the copper sheet and the ceramic substrate was inspected by using an ultrasonic flaw detector (FineSAT200 manufactured by Hitachi Solutions, Ltd.). A case where peeling of the copper sheet from the ceramic substrate or ceramic breaking was observed in 3 pieces or more out of 10 pieces was evaluated as "C", a case where peeling of the copper sheet from the ceramic substrate or ceramic breaking was observed in 1 piece or more and 2 pieces or less out of 10 pieces was evaluated as "B", and a case where peeling of the copper sheet from the ceramic substrate or ceramic breaking was not observed in all 10 pieces was evaluated as "A". The evaluation results are shown in Table 1.

In Comparative Example 1 in which the temperature increase rate in the temperature range of 480° C. or higher and lower than 650° C. was set to 2° C./min, the Mg—N compound phase was not formed at the bonded interface. Therefore, the initial bonding rate was low. In addition, when ultrasonic welding was performed, peeling of the copper sheet from the ceramic substrate or ceramic breaking was frequently observed.

On the other hand, in Invention Examples 1 to 9 in which the Mg—N compound phase was formed at the bonded interface, the initial bonding rate was high, and the ceramic substrate and the copper sheet could be firmly bonded to each other. Then, when ultrasonic welding was performed, peeling of the copper sheet from the ceramic substrate or ceramic breaking was small.

Example 2

As in Example 1, a ceramic substrate (40 mm×40 mm×0.32 mm) made of silicon nitride ($Si_3N_4$) was prepared.

A copper sheet (37 mm×37 mm×thickness of 0.5 mm) made of oxygen-free copper was bonded to both surfaces of the ceramic substrate under the conditions shown in Table 2 to obtain an insulating circuit substrate (copper/ceramic bonded body) of Invention Examples 11 to 19. A degree of vacuum of a vacuum furnace at the time of bonding was set to $2\times10^{-3}$ Pa.

The obtained insulating circuit substrate (copper/ceramic bonded body) was evaluated for the presence or absence of the Mg—N compound phase at the bonded interface, the number density of the Mg—N compound phases having the longitudinal direction length of 100 nm or more, and the initial bonding rate as in Example 1. Further, the Si concentration and the number of defectives in the Mg—N compound phase were evaluated as follows.

(Si Concentration in Mg—N Compound Phase)

An observation specimen was collected from the central portion of the obtained insulating circuit substrate (copper/

TABLE 1

| | Mg disposing step Amount of Mg mg/cm² | Bonding step | | | Bonded interface | | | |
|---|---|---|---|---|---|---|---|---|
| | | Load MPa | Temperature increase rate *1 ° C./min | Holding temperature ° C. | Holding time min | Presence or absence of Mg—N compound phase | Number density*2 (piece/μm) | Initial bonding rate % | Evaluation of ultrasonic welding |
| Invention Example 1 | 0.70 | 0.049 | 5 | 680 | 150 | Present | 8.2 | 96.1 | A |
| Invention Example 2 | 0.35 | 0.98 | 5 | 650 | 30 | Present | 4.6 | 92.4 | B |
| Invention Example 3 | 0.35 | 0.98 | 25 | 650 | 30 | Present | 8.0 | 94.2 | A |
| Invention Example 4 | 2.61 | 0.98 | 7 | 800 | 60 | Present | 33.9 | 95.6 | A |
| Invention Example 5 | 0.70 | 0.98 | 5 | 750 | 90 | Present | 15.4 | 95.2 | A |
| Invention Example 6 | 2.61 | 0.98 | 15 | 850 | 150 | Present | 39.2 | 96.5 | A |
| Invention Example 7 | 4.35 | 3.43 | 25 | 850 | 120 | Present | 43.2 | 95.5 | A |
| Invention Example 8 | 4.35 | 0.49 | 15 | 800 | 60 | Present | 36.2 | 99.5 | A |
| Invention Example 9 | 0.70 | 0.49 | 7 | 750 | 90 | Present | 16.5 | 98.7 | A |
| Comparative Example 1 | 0.70 | 0.49 | 2 | 750 | 90 | Absent | 0.0 | 90.4 | C |

*1 Temperature increase rate: average temperature increase rate in temperature range of 480° C. or higher and lower than 650° C.
*2 Number density of Mg—N compound phases having length of 100 nm or more at bonded interface ceramic bonded body), and the bonded interface between the copper sheet and the ceramic substrate was observed in a range of 2 μm×2 μm at an acceleration voltage of 200 kV and a magnification of 20,000 by using a transmission electron microscope (Titan ChemiSTEM manufactured by FEI Company), and the Si concentration with respect to 100 atomic % of the total of Mg, N, and Si was measured in a region where Mg and N coexisted. The Si concentration was measured in 5 fields, and the average value is shown in Table 2.

(Number of Defectives)

A copper terminal (10 mm×5 mm×1.5 mm in thickness) was bonded to the obtained insulating circuit substrate (copper/ceramic bonded body) by ultrasonic welding using an ultrasonic metal bonding machine (60C-904 manufactured by Ultrasonic Engineering Co., Ltd.) under the condition where a collapse amount was 0.5 mm. Ten copper terminals were bonded at a time.

After bonding, the bonded interface between the copper sheet and the ceramic substrate was inspected by using an ultrasonic flaw detector (FineSAT200 manufactured by Hitachi Solutions, Ltd.). A case where peeling of the copper sheet from the ceramic substrate or ceramic breaking was observed was regarded as "defective", and the number thereof is shown in Table 2.

INDUSTRIAL APPLICABILITY

According to the present invention, it is possible to provide a copper/ceramic bonded body, an insulating circuit substrate, a method for producing a copper/ceramic bonded body, and a method for producing an insulating circuit substrate, which can suppress peeling of a copper member from a ceramic member and generation of cracks in the ceramic member even when ultrasonic welding is performed.

EXPLANATION OF REFERENCE SIGNS

10: Insulating circuit substrate (copper/ceramic bonded body)
11: Ceramic substrate (ceramic member)
12: Circuit layer (copper member)
13: Metal layer (copper member)
41: Mg—N compound phase

What is claimed is:

1. A copper/ceramic bonded body comprising:
a copper member made of copper or a copper alloy; and
a ceramic member made of silicon nitride,
wherein the copper member and the ceramic member are bonded to each other,

TABLE 2

| | Mg disposing step Amount of Mg mg/cm$^2$ | Bonding step | | | Mg—N compound phase | | | | |
|---|---|---|---|---|---|---|---|---|---|
| | | Load MPa | Temperature increase rate *$^1$ ° C./min | Holding temperature ° C. | Holding time min | Presence or absence | Si concentration (atomic %) | Number density*$^2$ (piece/μm) | Initial bonding rate % | Number of defectives (piece) |
| Invention Example 11 | 2.61 | 0.98 | 7 | 800 | 60 | Present | 16.5 | 33.9 | 95.6 | 0 |
| Invention Example 12 | 2.61 | 0.98 | 7 | 800 | 90 | Present | 17.1 | 34.1 | 96.7 | 0 |
| Invention Example 13 | 2.61 | 0.98 | 7 | 800 | 120 | Present | 21.1 | 35.5 | 95.9 | 0 |
| Invention Example 14 | 0.70 | 0.98 | 5 | 700 | 90 | Present | 5.2 | 8.3 | 97.3 | 2 |
| Invention Example 15 | 0.70 | 0.98 | 5 | 730 | 90 | Present | 8.2 | 10.2 | 95.9 | 1 |
| Invention Example 16 | 0.70 | 0.98 | 5 | 750 | 90 | Present | 9.7 | 15.4 | 95.2 | 0 |
| Invention Example 17 | 4.35 | 3.43 | 25 | 850 | 120 | Present | 21.3 | 42.3 | 95.0 | 0 |
| Invention Example 18 | 4.35 | 3.43 | 25 | 850 | 180 | Present | 24.7 | 43.2 | 95.5 | 0 |
| Invention Example 19 | 4.35 | 3.43 | 25 | 850 | 240 | Present | 36.1 | 45.6 | 95.4 | 5 |

*$^1$ Temperature increase rate: average temperature increase rate in temperature range of 480° C. or higher and lower than 650° C.
*$^2$Number density of Mg—N compound phases having length of 100 nm or more at bonded interface In Invention Examples 11 to 18 in which the Si concentration in the Mg—N compound phase was 25 atomic % or less, the number of defectives at the time of ultrasonic welding was smaller than that in Invention Example 19 in which the Si concentration in the Mg—N compound phase exceeded 25 atomic %. It was presumed that the local precipitation of the Si single phase was suppressed and the strength of the Mg—N compound phase was ensured.

As a result, according to the invention examples, it was confirmed that it is possible to provide a copper/ceramic bonded body, an insulating circuit substrate, a method for producing a copper/ceramic bonded body, and a method for producing an insulating circuit substrate, which can suppress peeling of a copper member from a ceramic member and generation of cracks in the ceramic member even when ultrasonic welding is performed.

a Mg—N compound phase extending from a ceramic member side to a copper member side is present at a bonded interface between the copper member and the ceramic member,
at least a part of the Mg—N compound phase enters into the copper member, and
a Si concentration in the Mg—N compound phase is 9.7 atomic % or more and 25 atomic % or less.

2. The copper/ceramic bonded body according to claim 1, wherein in a unit length along a bonded interface, a number density of the Mg—N compound phases having a longitudinal direction length of 100 nm or more is 8 pieces/μm or more.

3. An insulating circuit substrate comprising:
a copper sheet made of copper or a copper alloy; and
a ceramic substrate made of silicon nitride, wherein the copper sheet is bonded to a surface of the ceramic substrate, a Mg—N compound phase extending from a ceramic substrate side to a copper sheet side is present at a bonded interface between the copper sheet and the ceramic substrate, and at least a part of the Mg—N compound phase enters into the copper sheet, and a Si concentration in the Mg—N compound phase is 9.7 atomic % or more and 25 atomic % or less.

4. The insulating circuit substrate according to claim 3, wherein in a unit length along a bonded interface, a number density of the Mg—N compound phases having a longitudinal direction length of 100 nm or more is 8 pieces/µm or more.

5. A method for producing the copper/ceramic bonded body according to claim 1, the method comprising:

a Mg disposing step of disposing Mg between the copper member and the ceramic member;

a laminating step of laminating the copper member and the ceramic member with Mg interposed therebetween; and a bonding step of performing a heating treatment on the laminated copper member and ceramic member with Mg interposed therebetween in a state of being pressed in a lamination direction under a vacuum atmosphere to bond the copper member and the ceramic member to each other, wherein, in the Mg disposing step, an amount of Mg is set to be in a range of 0.34 mg/cm$^2$ or more and 4.35 mg/cm$^2$ or less, and in the bonding step, a temperature increase rate in a temperature range of 480° C. or higher and lower than 650° C. is set to be 5° C./min or higher, and heating is held at a temperature of 650° C. or higher for 30 minutes or longer.

6. A method for producing the insulating circuit substrate according to claim 3, the method comprising:

a Mg disposing step of disposing Mg between the copper sheet and the ceramic substrate;

a laminating step of laminating the copper sheet and the ceramic substrate with Mg interposed therebetween; and a bonding step of performing a heating treatment on the laminated copper sheet and ceramic substrate with Mg interposed therebetween in a state of being pressed in a lamination direction under a vacuum atmosphere to bond the copper sheet and the ceramic substrate to each other, wherein, in the Mg disposing step, an amount of Mg is set to be in a range of 0.34 mg/cm$^2$ or more and 4.35 mg/cm$^2$ or less, and in the bonding step, a temperature increase rate in a temperature range of 480° C. or higher and lower than 650° C. is set to be 5° C./min or higher, and heating is held at a temperature of 650° C. or higher for 30 minutes or longer.

7. A method for producing the copper/ceramic bonded body according to claim 2, the method comprising:

a Mg disposing step of disposing Mg between the copper member and the ceramic member;

a laminating step of laminating the copper member and the ceramic member with Mg interposed therebetween; and a bonding step of performing a heating treatment on the laminated copper member and ceramic member with Mg interposed therebetween in a state of being pressed in a lamination direction under a vacuum atmosphere to bond the copper member and the ceramic member to each other, wherein, in the Mg disposing step, an amount of Mg is set to be in a range of 0.34 mg/cm$^2$ or more and 4.35 mg/cm$^2$ or less, and in the bonding step, a temperature increase rate in a temperature range of 480° C. or higher and lower than 650° C. is set to be 5° C./min or higher, and heating is held at a temperature of 650° C. or higher for 30 minutes or longer.

8. A method for producing the insulating circuit substrate according to claim 4, the method comprising:

a Mg disposing step of disposing Mg between the copper sheet and the ceramic substrate;

a laminating step of laminating the copper sheet and the ceramic substrate with Mg interposed therebetween; and a bonding step of performing a heating treatment on the laminated copper sheet and ceramic substrate with Mg interposed therebetween in a state of being pressed in a lamination direction under a vacuum atmosphere to bond the copper sheet and the ceramic substrate to each other, wherein, in the Mg disposing step, an amount of Mg is set to be in a range of 0.34 mg/cm$^2$ or more and 4.35 mg/cm$^2$ or less, and in the bonding step, a temperature increase rate in a temperature range of 480° C. or higher and lower than 650° C. is set to be 5° C./min or higher, and heating is held at a temperature of 650° C. or higher for 30 minutes or longer.

* * * * *